(12) United States Patent
Fujita

(10) Patent No.: US 7,462,562 B2
(45) Date of Patent: Dec. 9, 2008

(54) FABRICATION METHOD OF SEMICONDUCTOR DEVICE

(75) Inventor: Osamu Fujita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 20 days.

(21) Appl. No.: 11/546,310

(22) Filed: Oct. 12, 2006

(65) Prior Publication Data

US 2007/0087521 A1    Apr. 19, 2007

(30) Foreign Application Priority Data

Oct. 17, 2005    (JP) .............................. 2005-301452

(51) Int. Cl.
*H01L 21/311* (2006.01)

(52) U.S. Cl. .................. 438/700; 438/706; 438/712; 257/E21.17; 257/E21.218; 257/E21.227; 257/E21.304; 257/E21.546

(58) Field of Classification Search ................. 438/700, 438/270, 513, 680, 692, 706, 712, 743, 74, 438/733, 744
See application file for complete search history.

(56) References Cited

U.S. PATENT DOCUMENTS

| 2001/0023960 A1* | 9/2001 | Soga et al. .................. 257/330 |
| 2006/0087000 A1* | 4/2006 | Okuno ........................ 257/506 |

FOREIGN PATENT DOCUMENTS

| JP | 2001-244325 | 9/2001 |
| JP | 2002-43413 | 2/2002 |
| JP | 2002-184856 | 6/2002 |

\* cited by examiner

*Primary Examiner*—David Nhu
(74) *Attorney, Agent, or Firm*—Young & Thompson

(57) ABSTRACT

Fabrication method of semiconductor device to reduce leak current at junction interface of p-type well and n-type well. The method includes forming a first trench portion by selective dry etching of a silicon substrate using a first etching gas and forming a second trench portion including an enlarged width portion downward from a bottom of the first trench portion by additional dry etching of a silicon substrate at the bottom of the first trench portion using a second etching gas. A mixture gas of a chlorine gas and a fluorocarbon gas is used as the second etching gas and also a bias voltage lower than that in the process to form the first trench portion are used in the process to form the second trench portion.

5 Claims, 3 Drawing Sheets

FABRICATION METHOD OF SEMICONDUCTOR DEVICE

FIELD OF THE INVENTION

This invention relates to a fabrication method of a semiconductor device having a trench of predetermined shape.

BACKGROUND OF THE INVENTION

Patent documents 1 to 3, for example, describe fabrication methods of conventional semiconductor devices.

Patent document 1 describes a method to round an angular corner of the bottom of a trench by isotropic etching after formation of the trench on a silicon substrate by anisotropic etching. According to this method a RIE (Reactive Ion Etching) device is used for the anisotropic etching and a CDE (Chemical Dry Etching) device is used for the isotropic etching. A mixture gas of SF6 or CF4 and O2 gases is used as an etching gas for the isotropic etching.

Patent document 2 describes a method of lateral etching at the bottom of a trench by isotropic etching after formation of the trench on a silicon substrate by anisotropic etching. According to this method a mixture gas including Cl2 and O2 gases is used as an etching gas for the isotropic etching.

Patent document 3 describes a method of formation of a trench by dry etching of a silicon substrate using a mixture gas of CF4 and Cl2 gases as an etching gas under application of a bias voltage.

[Patent Document 1]
 Japanese Patent Kokai Publication No. JP-P2001-244325A

[Patent Document 2]
 Japanese Patent Kokai Publication No. JP-P2002-43413A

[Patent Document 3]
 Japanese Patent Kokai Publication No. JP-P2002-184856A

SUMMARY OF THE DISCLOSURE

However, it is difficult to form every trench into desired shape precisely using the fabrication methods of semiconductor devices described in patent documents 1 and 2. Therefore impurities are implanted in areas other than the predetermined region when wells on a silicon substrate are formed and occasionally a junction interface between a p-type well and an n-type well is not positioned below an element separation film. Thus it causes leak current at the junction interface between the p-type well and n-type well.

In other words, to form the wells on the silicon substrate a mask is formed so that an end portion of a resist film is positioned just above the element separation film, and impurities are implanted using the mask. Recently as the size of transistor is reduced, the width of the element separation film becomes narrower. Therefore the impurities are implanted in areas other than the desired region due to failure in precise positioning of the resist film or further implantation angle of the impurities, and occasionally the junction interface between the p-type well and n-type well is not positioned below the element separation film. Therefore, it caused leak current at the junction interface between these wells.

Patent document 3 describes a method of formation of a trench by dry etching of a silicon substrate using a mixture gas of CF4 and Cl2 gases as an etching gas under application of a bias-voltage. Even such kind of etching method is used to etch the bottom of the trench, however, it happens that leak current is generated at the junction interface between the p-type well and n-type well as above mentioned. Accordingly, there is much desired in the art, and it is an object of the present invention to provide a breakthrough in the art.

According to a first aspect of the present invention, there is provided a fabrication method of a semiconductor device. The method comprises the following steps:

forming a first trench portion by selective dry etching of a silicon substrate using a first etching gas;

forming a second trench portion including an enlarged width portion downward from the bottom of the first trench portion by additional dry etching of the silicon substrate at the bottom of the first trench using a second etching gas.

A mixture gas of a chlorine gas and a fluorocarbon gas is used as the second etching gas, and a bias voltage lower than that in the step of forming the first trench portion is used in the step of forming the second trench portion.

According to the fabrication method of the present invention, every trench is formed precisely to have the first trench portion and the second trench portion with an enlarged width portion downward from the bottom of the first trench portion.

Then an element separation film with the enlarged width portion at the bottom can be formed by embedding an insulating film in the trench composed of these trench portions. Because of this structure, impurities are not implanted in the areas other than the desired region, which might occur due to imprecise positioning of the resist film or further depending on the implantation angle of the impurities during formation of p-type well and n-type well on the silicon substrate. That is, a large margin for the implantation of impurities can be obtained by this shape and a junction interface between the p-type well and the n-type well is precisely positioned below the element separation film. Therefore the current leakage at the junction interface between these wells can be reduced.

The meritorious effects of the present invention are summarized as follows.

According to the present invention, because the second trench portion having the enlarged width portion downward from the bottom of the first trench portion can be formed precisely. There is provided a fabrication method of semiconductor device in which the leak current at the junction interface between the p-type well and n-type well is reduced is provided.

PREFERRED EMBODIMENTS OF THE INVENTION

An embodiment of the present invention is explained using drawings, in which similar symbols refer to similar components and further explanation will be omitted.

A fabrication method of semiconductor device according to an embodiment comprises following steps.

Figure 1A:
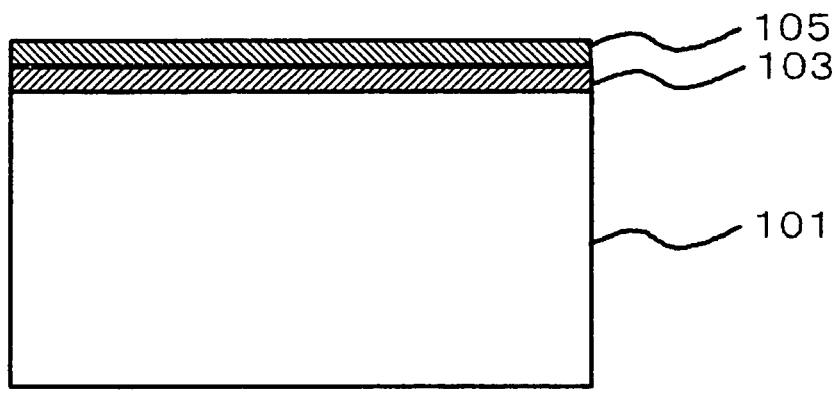
FIGS. 1A, 1B and 1C are schematic cross sectional views illustrating a fabrication method of a semiconductor device according to one embodiment of the present invention.
Figure 1B:
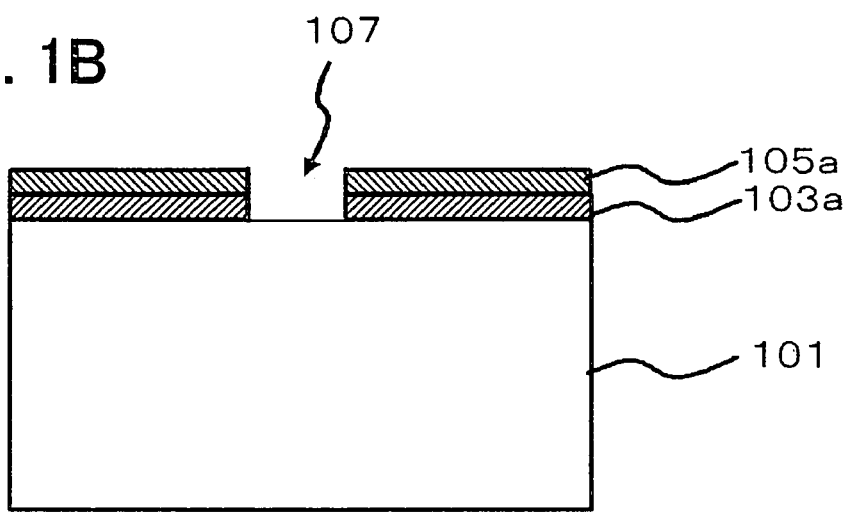
Figure 1C:
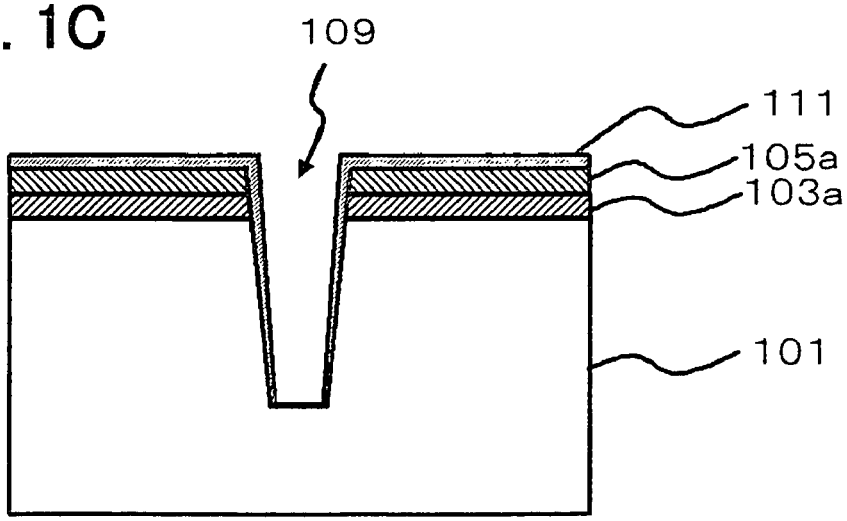

(1) A process of forming a first trench portion by selective dry etching of a silicon substrate using a first etching gas (See FIGS. 1A to 1C).

Figure 2A:
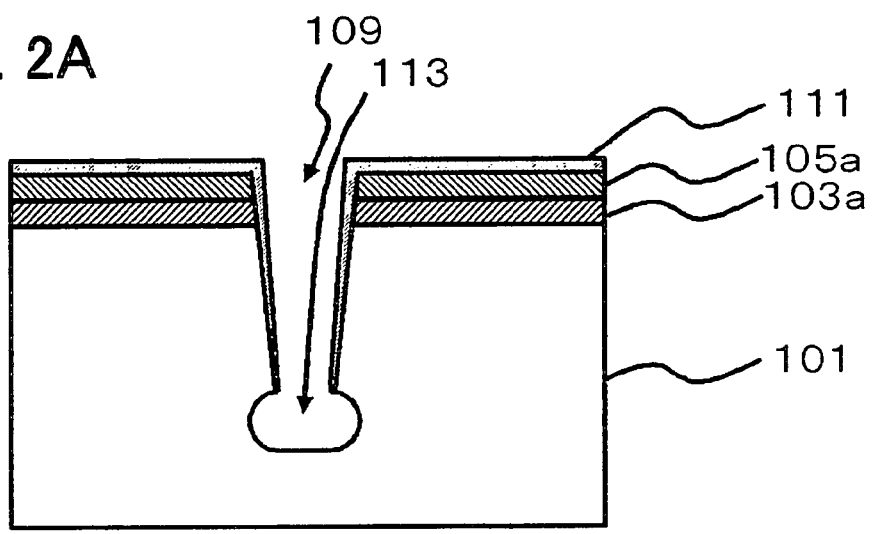
FIGS. 2A, 2B and 2C are schematic cross sectional views illustrating the fabrication method of the semiconductor device according to one embodiment of the present invention.
Figure 2B:
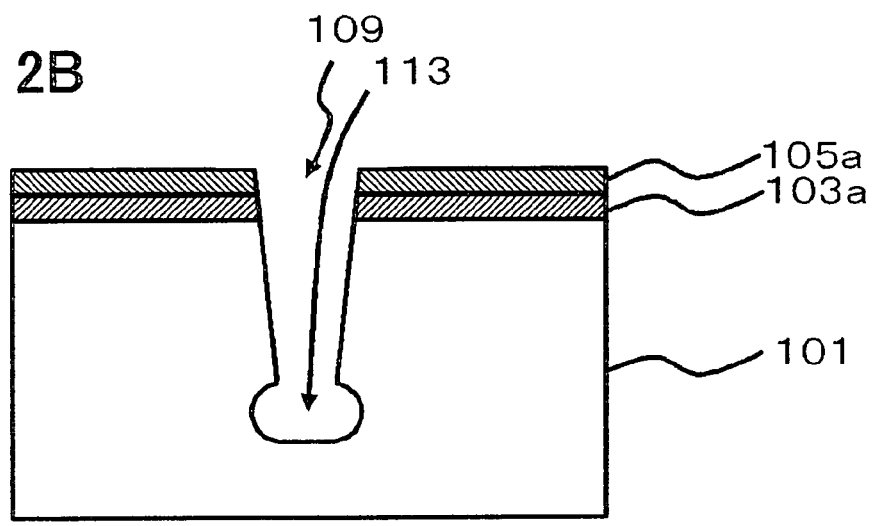
Figure 2C:
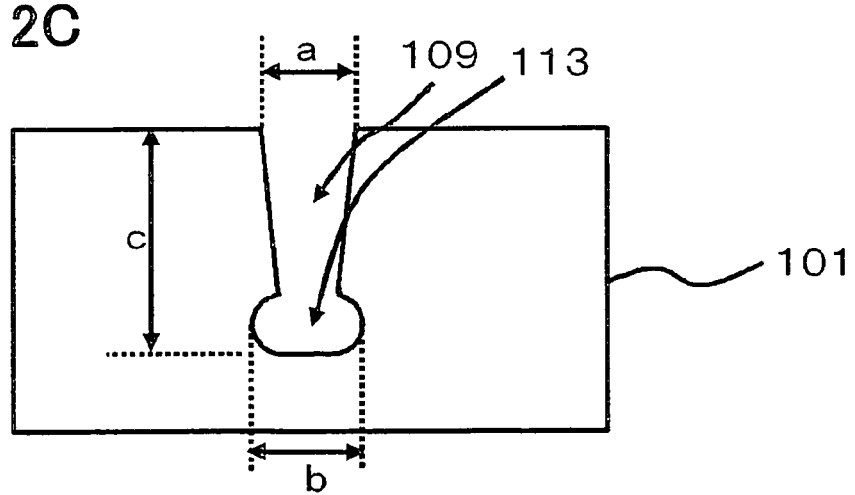

(2) A process of forming a second trench portion including an enlarged width portion downward from the bottom of the first trench portion by additional dry etching of the silicon substrate at the bottom of the first trench portion using a second etching gas (See FIGS. 2A to 2C).

Figure 3A:
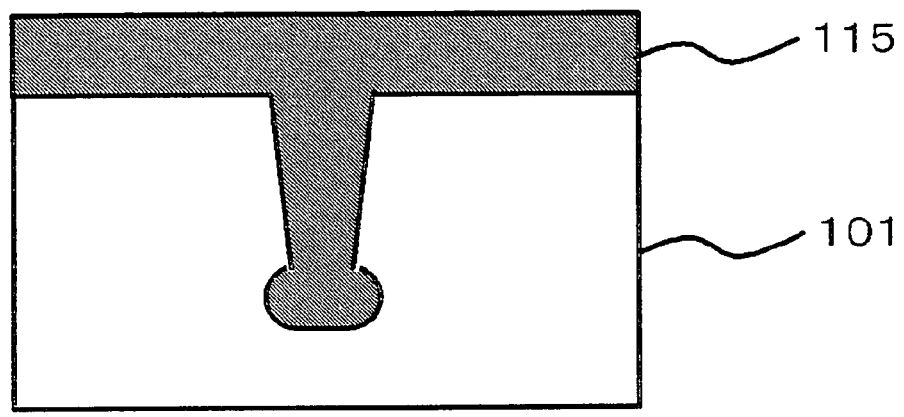
FIGS. 3A and 3B are schematic cross sectional views illustrating the fabrication method of the semiconductor device according to one embodiment of the present invention.
Figure 3B:
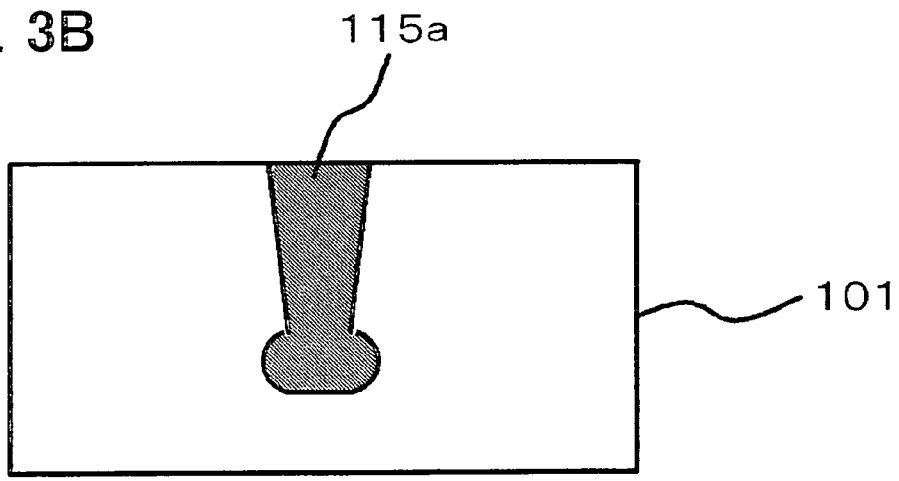

(3) A process of forming an insulating film by heat treatment after application of a coating liquid containing polysilazane to fill up (embed) the first trench portion and the second trench portion (See FIGS. 3A and 3B).

The fabrication method of semiconductor device according to the embodiment is, at first, to form a laminate by layering a first insulating film 103 and a second insulating film 105 successively on the silicon substrate 101 (FIG. 1A).

Such as silicon oxide film, e.g., can be used for the first insulating film and formed by thermal oxidation method or CVD (Chemical Vapor Deposition) method, for example. And such as silicon nitride film, e.g., can be used for the second insulating film and formed by CVD method, for example. The lamination structure of two layered insulating films is explained for the embodiment, however, other insulating film of single layered or more than two layered structure can be employed.

Next, a resist film (not shown) is formed on the second insulating film 105 and a mask pattern is transferred onto the resist film using conventional lithography technique. Then the first insulating film 103 and the second insulating film 105 are removed by etching using the resist film as a mask to form an opening 107 at a predetermined location (FIG. 1B).

Next, the first trench portion 109 is formed by selective anisotropic etching of the silicon substrate 101 using a first etching medium (e.g., gas) with a mask of the first insulating film 103a and the second insulating film 105a a in which the opening 107 is formed. The first trench portion 109 has a tapered shape. A layer of reaction products 111 over the inside wall of the first trench portion 109 and the surface of the second insulating film 105a is also formed when the first trench portion 109 is formed (FIG. 1C).

The anisotropic etching is performed in a RIE (Reactive Ion Etching) device. The etching conditions for the embodiment are as follows:

First etching gas; mixture gas of HBr/O2/N2

Gas flow rate; HBr:O2:N2=80:3:2 (sccm)

Bias voltage; 300 (V)

The second trench portion 113 including an enlarged width portion downward of the bottom of the first trench portion 109 is formed by additional dry etching of a silicon substrate 101 at the bottom of the first trench portion 109 using a second etching medium (e.g., gas) (FIG. 2A).

A formation of the second trench portion 113 is successively performed in the same RIE (Reactive Ion Etching) device used for the formation of the first trench portion 109. For this reason the second trench portion 113 can be formed with keeping a vacuum in the device, that is, without exposure of the silicon substrate 101 to the air.

A mixture gas of a chlorine gas and a fluorocarbon gas is used as the second etching gas for the embodiment. Compounds denoted CnF2n+2 (n=integer) such as C3F8 or CF4, for example, may be used as the fluorocarbon gas and a CF4 gas can be used for the embodiment. The etching gas may contain such as inactive gases. The inactive gases may include N2, inert gas such as, Ar, He, and so on.

By using such a mixture gas, the etching of the reaction products layer 111 formed on the sidewall of the first trench portion 109, the first insulating film 103a and the second insulating film 105a is inhibited on the one hand, and the etching of the silicon substrate 101 at the bottom of the first trench portion 109 is accelerated on the other hand. That is, the second trench portion 113 having a desired shape can be formed by selecting an appropriate mixture ratio of chlorine gas and fluorocarbon gas. Specifically the mixture ratio of chlorine and fluorocarbon may be 1:10 to 10:1. A prominent effect can be obtained by the dry etching using the gas of this mixture ratio.

In addition, a bias voltage applied during a formation of the second trench portion 113 must be lower than that applied during the step of forming the first trench portion 109. In this embodiment the bias voltage is not applied, however, it does not mean to exclude a possibility to apply a bias voltage within a range to retain the effect of this embodiment.

An etching time may be selected properly in consideration of the desired shape of the second trench portion 113 and the mixture ratio of the mixture gas.

Next, the reaction products layer 111 is removed by a solution of diluted hydrogen fluoride (HF) (FIG. 2B). And the first insulating film 103a and the second insulating film 105a are removed by the conventional CMP (Chemical Mechanical Polishing) method, etc. to form a trench structure (the first trench portion 109 and the second trench portion 113) according to the embodiment (FIG. 2C).

The width "a" of the opening on the silicon substrate 101 can be greater than or equal to 40 nm and less than or equal to 140 nm, the maximum width "b" of the second trench portion 113 can be greater than or equal to 40 nm and less than or equal to 140 nm, and the depth "c" from the surface of the silicon substrate 101 can be greater than or equal to 100 nm and less than or equal to 500 nm for the trench structure. In the embodiment a trench having an opening width "a" of approximately 60 nm, maximum width "b" of approximately 60 nm, and depth "c" of approximately 300 nm, respectively, was formed.

Further, the coating liquid (not shown) containing polysilazane is applied to fill up the first trench portion 109 and the second trench portion 113 and heated to form the insulating film (silicon oxide film 115) in the embodiment (FIGS. 3A).

Specifically, the coating liquid containing polysilazane can be applied on the surface of the silicon substrate 101 by spincoat method, for example, to fill up the first trench portion 109 and the second trench portion 113.

A coating liquid containing polysilazane is prepared by dissolution of polysilazane into a predetermined solvent such as xylene or aromatic solvent, etc. and may include catalyst and so on. A perhydroxopolysilazane composed of multiple units of "—(SiH2NH)—" can be selected for polysilazane.

The liquid film (not shown) containing polysilazane applied on the silicon substrate 101 is then heated into silicon oxide film 115. A condition of the heat treatment can be approximately at 100° C. to 500° C. and under an atmosphere containing H2O and oxygen or containing ozone. The silicon oxide film 115 is formed by heat treatment of the polysilazane in the liquid into amorphous SiO2 (FIG. 3A).

And then the silicon oxide film 115 outside of the trench is removed by the conventional CMP method etc. and an element separation film 115a is formed (FIG. 3B).

After that, a semiconductor device is fabricated by forming wells, gate electrodes, diffusion layer and so on using the conventional method.

The effects of the embodiment are as follows.

A mixture gas of a chlorine gas and a fluorocarbon gas is used as a second etching gas to form a second trench portion in the embodiment.

A chlorine gas, generally, etches silicon mainly and has a high selectivity to the layer of reaction products formed on the sidewall of the first trench portion. On the other hand a fluorocarbon gas etches the layer of reaction products but it has no etching selectivity and also etches the silicon and the insulating film. By using the mixed gas, two conflicting purposes, one is to keep the selectivity to the reaction products layer and masking layer, the other is to etch silicon at the bottom of the first trench, can be achieved.

Moreover, a lower bias voltage is impressed for the etching to form the second trench portion than that used to form the first trench portion in the embodiment.

According to the embodiment, the second trench portion with an enlarged width portion downward from the bottom of the first trench portion can be formed precisely by the isotropic etching at the bottom of the first trench portion.

The element separation film with the enlarged width portion at the bottom is to be formed by forming an insulating film in a trench composed of the trench portions. Because of this structure, impurities are not implanted in areas other than the desired region due to imprecise positioning of the resist film or implantation angle of the impurities during a formation of the p-type well and n-type well on the silicon substrate. Then a junction interface between of the p-type well and the n-type well is positioned just below the element separation film, and the leak current at the junction interface between these wells can be reduced.

In addition, according to the embodiment of fabrication method of semiconductor devices, yield of the semiconductor devices is improved. Conventional fabrication methods of the semiconductor devices generate a dispersion of the shape of the trench and it causes low yield of the semiconductor devices. However, precise formation of the trench to the uniform shape makes it possible to improve the yield of semiconductor devices by the embodiment.

Further, the step of forming the second trench portion may be performed without bias voltage.

The silicon substrate at the bottom of the first trench portion is etched effectively to the lateral direction by this condition and the second trench portion 113 having the predetermined shape can be formed efficiently.

Furthermore, CF4 gas is used as a fluorocarbon for an etching gas.

Because a mixture gas of Cl2 and CF4 is used as the etching gas, an etching of the reaction products layer formed on the sidewall of the first trench portion is suppressed, on the other hand, an etching of the silicon substrate at the bottom of the first trench portion is facilitated. Consequently the second trench portion having a desired shape can be formed efficiently.

Besides, both steps of forming the first trench portion 109 and the second trench portion 113 are performed in the same device, which contributes constant formation of desired shape of the trenches.

A fabrication method of a semiconductor device described in patent document 1, an anisotropic etching and an isotropic etching are performed in different devices. Therefore the fabrication processes become complicated and it causes instability of forming a desired shape of the trench due to a change of property of the reaction products layer because the reaction products layer is exposed to the air when the substrate is transferred to the isotropic etching device.

On the contrary, in the embodiment, the fabrication steps of forming the trench portions are performed in the same device without breaking the vacuum, that is, without exposure of the substrate to the air. Then a constant formation of desired shape of the trenches can be realized by a simple method.

In addition, the second trench portion is formed by isotropic dry etching of the silicon substrate.

The desired shape of the second trench portion can be easily obtained by the method.

The embodiment includes a step that a coating liquid containing polysilazane is applied to fill up the first trench portion 109 and the second trench portion 113 and heated to form an insulating film after the formation step of the second trench portion 113.

For this step the insulating film can be filled completely and an element separation film can be formed in the second trench portion having an enlarged width portion downward from the bottom of the first trench portion. By virtue of the element separation film with such kind of shape, impurities are not implanted in the areas other than the desired region due to imprecise positioning of the resist film or implantation angle of the impurities during a formation of p-type well and n-type well on the silicon substrate. Then a junction interface between the p-type well and the n-type well is positioned below the element separation film, and the leak current at the junction interface between these wells can be reduced.

The embodiment of the invention above mentioned with the drawings is merely illustrative and various kinds of compositions other than the embodiment can be adaptable.

For instance the first trench portion 109 has a tapered shape in the embodiment, however, no limitations are intended to this shape but the diameter of the first trench portion may be the same or slightly enlarged downwardly.

And the cross section of the second trench portion 113 is oval in the embodiment, however, approximately spherical, conical or cylindrical shape that have an enlarged width portion downwardly is also acceptable.

EXAMPLES

Example 1

A semiconductor device was fabricated by the fabrication method of the preferred embodiment with the following etching conditions for formation of the trench portions.

Dry etching condition for a formation of the first trench portion;
Etching device: RIE (Reactive Ion Etching) device,
First etching gas: mixture gas of HBr/O2/N2,
Gas flow rate: HBr:O2:N2=80:3:2 (sccm),
Bias voltage: 300 (V),
Etching time: 45 (sec)

Dry etching condition for a formation of the second trench portion;
Etching device: RIE (Reactive Ion Etching) device,
Second etching gas: mixture gas of Cl2/CF4,
Gas flow rate: Cl2:CF4=1:5 (sccm),
Bias voltage: 0 (V),
Etching time: 200 (sec)

It was confirmed that the trench portion composed of the first trench portion tapered downwardly and the second trench portion having the enlarged width portion downward from the bottom of the first trench portion was formed on the silicon substrate by the dry etching of the conditions above.

[Comparative Example 1]

A semiconductor device was fabricated by the same conditions of Example 1 except the condition for the second trench portion, which was as follows.

Dry etching condition for a formation of the second trench portion;
Etching device: RIE (Reactive Ion Etching) device,
Second etching gas: mixture gas of Cl2/CF4,
Gas flow rate: Cl2:CF4=1:5 (sccm),
Bias voltage: 500 (V),
Etching time: 200 (sec)

It was confirmed that an additional trench portion downwardly tapered from the bottom of the first trench portion 109 was formed on the silicon substrate by the dry etching of the conditions above.

[Comparative Example 2]

A semiconductor device was fabricated by the same conditions of Example 1 except the condition for the second trench portion, which was as follows.

Dry etching condition for a formation of the second trench portion;
Etching device: RIE (Reactive Ion Etching) device,
Second etching gas: mixture gas of HBr/CF4,
Gas flow rate: HBr:CF4=1:5 (sccm),
Bias voltage: 0 (V),
Etching time: 200 (sec)

No dry etching was observed at the bottom of the first trench portion 109 and the second trench portion having the enlarged width portion downward from the bottom of the first trench portion was not formed by the dry etching of the conditions above.

[Comparative Example 3]

A semiconductor device was fabricated by the same conditions of the embodiment 1 except the condition for the second trench portion, which was as follows.

Dry etching condition for a formation of the second trench portion;
Etching device: RIE (Reactive Ion Etching) device,
Second etching gas: Cl2 gas, solely
Bias voltage: 0 (V),
Etching time: 200 (sec)

A reaction products layer formed on the sidewall of the first trench portion was not etched but the silicon at the bottom of the first trench portion was anisotropically etched. A downwardly tapered trench portion was then formed on the silicon substrate, however, the second trench portion having the enlarged width portion downward from the bottom of the first trench portion was not formed.

[Comparative Example 4]

A semiconductor device was fabricated by the same conditions of Example 1 except the condition for the second trench portion, which was as follows.

Dry etching condition for a formation of the second trench portion;
Etching device: RIE (Reactive Ion Etching) device,
Second etching gas: CF4 gas, solely
Bias voltage: 0 (V),
Etching time: 200 (sec)

No selectivity of the etching was observed and all of the masking films (the first insulating film and the second insulating film), the reaction products layer on the sidewall of the first trench portion and the silicon substrate were etched by the conditions above. For this reason the first trench portion was isotropically etched laterally, too, likewise the bottom portion of the first trench portion, and the desired trench shape was not formed.

Thus, it was confirmed that the second trench portion having the enlarged width portion downward from the bottom of the first trench portion was formed on the silicon substrate in Example 1. Also it was confirmed that the element separation film was formed in the trench portions of the semiconductor device of Example 1 and a leak current at the junction interface between the p-type well and n-type well was decreased. The defect rate of the semiconductor devices was then reduced and the yield of the products was improved.

On the other hand, as for the Comparative Examples 1 to 3, a first trench portion tapered downwardly was formed on the silicon substrate, however, the second trench portion having the enlarged width portion downward from the bottom of the first trench portion was not formed. Therefore impurities were implanted in the areas other than predetermined region due to imprecise positioning of the resist film when wells were formed on the silicon substrate causing high incidence of current leakage at the junction interface between the p-type well and n-type well.

As for the Comparative Example 4, the first trench portion is laterally enlarged and it means the width of the element separation film in the trench is enlarged. Then the yield of the products was reduced because the transistor field could not be secured enough (i.e., narrowed).

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A fabrication method of a semiconductor device comprising:
    forming a first trench portion by selective dry etching of a silicon substrate using a first etching gas and applying a bias voltage; and
    forming a second trench portion including an enlarged width portion downward from a bottom of the first trench portion by additional dry etching of a silicon substrate at the bottom of the first trench portion using a second etching gas;
    wherein a mixture gas of a chlorine gas and a fluorocarbon gas is used as the second etching gas, and
    wherein said forming of the second trench portion is performed by a condition without applying the bias voltage.

2. The fabrication method of claim 1, wherein the fluorocarbon gas is CF4.

3. The fabrication method of claim 1, wherein said forming of the first trench portion and said forming of the second trench portion are performed in the same device.

4. The fabrication method of claim 1, wherein said forming of the second trench portion is performed by isotropic dry etching of the silicon substrate.

5. A fabrication method of a semiconductor device comprising:
    forming a first trench portion by selective dry etching of a silicon substrate using a first etching gas; and
    forming a second trench portion including an enlarged width portion downward from the bottom of the first trench portion by additional dry etching of a silicon substrate at the bottom of the first trench using a second etching gas;

wherein a mixture gas of a chlorine gas and a fluorocarbon gas is used as the second etching gas and also a bias voltage lower than that in said forming of the first trench portion are used in forming the second trench portion; and after said forming of the second trench portion, forming an insulating film by heat treatment after application of a coating liquid containing polysilazane to fill up the first trench portion and the second trench portion.

* * * * *